United States Patent [19]
Tripathi et al.

[11] Patent Number: 5,974,089
[45] Date of Patent: Oct. 26, 1999

[54] METHOD AND APPARATUS FOR PERFORMANCE IMPROVEMENT BY QUALIFYING PULSES IN AN OVERSAMPLED NOISE-SHAPING SIGNAL PROCESSOR

[75] Inventors: Adya S. Tripathi; Cary L. Delano, both of San Jose, Calif.

[73] Assignee: Tripath Technology, Inc., Santa Clara, Calif.

[21] Appl. No.: 08/898,544

[22] Filed: Jul. 22, 1997

[51] Int. Cl.⁶ .................................................. H04B 14/06
[52] U.S. Cl. .......................... 375/247; 330/10; 330/207 A
[58] Field of Search ..................... 375/247, 245, 375/243; 330/10, 207 A, 251

[56] References Cited

U.S. PATENT DOCUMENTS

| | | | |
|---|---|---|---|
| 4,843,339 | 6/1989 | Burt et al. | 330/10 |
| 4,939,516 | 7/1990 | Early | 341/143 |
| 5,030,952 | 7/1991 | Ledzius et al. | 341/143 |
| 5,352,986 | 10/1994 | Modgil et al. | 330/10 |
| 5,451,900 | 9/1995 | Haga | 330/10 |
| 5,565,930 | 10/1996 | Bolger et al. | 348/572 |
| 5,777,512 | 7/1998 | Tripathi et al. | 330/207 A |

OTHER PUBLICATIONS

James C. Candy, et al., "Oversampling Methods for A/D and D/A Conversation," *Oversampling Delta–Sigma Data Converters*, pp. 1–29.

H. Ballan, et al., "12V Σ—ΔClass–D Amplifier in 5V CMOS Technology," 1995, Switzerland, *IEEE*, pp. 559–562.

T. Ritoniemi, et al., "Design of Stable High Order 1–Bit Sigma–Delta Modulators," May 1990, Finland, *IEEE*, pp. 127–130.

D. Grant, et al., "Theory and Applications," 1989, Canada, Power Mosfets.

B. Murari, et al., "Technologies and Applications," 1986, Berlin, Smart Power ICs.

J. Candy, et al., "Oversampling Delta–Sigma Data Converters," 1992, New York, IEEE.

*Primary Examiner*—Stephen Chin
*Assistant Examiner*—Mohammad Ghayour
*Attorney, Agent, or Firm*—Beyer & Weaver, LLP

[57] ABSTRACT

The transition time of power switching devices ultimately limits the rate at which such devices can be switched. Because the occurrence of unacceptably narrow pulses is relatively rare in an oversampled, noise-shaping signal processor, the elimination of such narrow pulses is introduced through the use of circuitry in the modulator loop which constrains the time between transitions to be greater than or equal to some minimum time period which, in turn provides for a smooth interface to power switching devices. However, because of the delay introduced by this pulse qualification circuitry, the modulator loop sampling frequency is increased to deal with any resulting instability. Thus, an oversampled, noise shaping signal processor is described having at least one integrator stage in a feedback loop. A sampling stage in the feedback loop is coupled to the at least one integrator stage. The sampling stage samples an analog signal at a sample frequency. Qualification logic coupled to the sampling stage receives a pulse waveform therefrom, and ensures that signal transitions in the pulse waveform occur more than a first time period apart and that the waveform can therefore be handled by, for example, a power switching device. A switching stage in the feedback loop is coupled to the qualification logic. The signal processor has a feedback path from the output of the switching stage to the input of the at least one integrator stage thereby closing the feedback loop.

27 Claims, 6 Drawing Sheets

METHOD AND APPARATUS FOR PERFORMANCE IMPROVEMENT BY QUALIFYING PULSES IN AN OVERSAMPLED NOISE-SHAPING SIGNAL PROCESSOR

BACKGROUND OF THE INVENTION

The present invention relates to the field of oversampled, noise-shaping signal processing which includes, for example, sigma-delta modulation technology. More specifically, the present invention provides methods and apparatus for improving the dynamic range and noise performance of an oversampled, noise-shaping modulator. Even more specifically, some embodiments of the present invention improve the performance of such modulators for the purpose of driving power switching devices.

In response to the inability of pulse width modulation (PWM) technology to provide both the dynamic range and the noise performance for a variety of high end and high power switching applications, several attempts have been made to design switching amplifiers using oversampled, noise-shaping modulators, specifically sigma-delta modulators, for their noise-shaping characteristics, see H. Ballan and M. Declercq, 12 V Σ-Δ Class-D Amplifier in 5 V CMOS Technology, pp. 559–562 (IEEE 1995 Custom Integrated Circuit Conference), the entirety of which is incorporated herein by reference. However, as will be discussed, including power MOS transistors in a sigma-delta modulator loop presents additional problems which hinder overall amplifier performance. A standard first order sigma-delta modulator 100 is shown in FIG. 1. An integrator 102 is connected in series with a comparator 104 which is essentially a two-level quantizer with a sampling rate $f_s$. The output of comparator 104 is fed back to integrator 102 via digital-to-analog converter (D/A) 106 and adder 108. The feedback forces the low frequency content of the quantized output signal to track the low frequency content of the input to modulator 100. Any difference between the quantized output and modulator input is accumulated in integrator 102 and eventually corrected. For first-order sigma-delta modulators, noise in the signal band due to quantization error is reduced by approximately 9 dB for each doubling of the oversampling ratio (OSR). The OSR is given by $f_s/2f_o$, where $2f_o$ is the Nyquist rate, i.e., twice the bandwidth $f_o$ of the baseband signal. For second-order sigma-delta modulators, this noise is reduced by approximately 15 dB (9 dB+6 dB) for the same increase in OSR. For third-order modulators, the reduction is 21 dB. However, noise improvements achieved by increases in the OSR, i.e., increases in $f_s$, are ultimately constrained as the rise and fall times of the output signal become significant with respect to the sample period. For a thorough discussion of sigma-delta modulation techniques, see Candy and Temes, *Oversampling Delta-Sigma Data Converters*, pp. 1–25 (IEEE Press, 1992), the entirety of which is incorporated herein by reference.

As mentioned above, the insertion of power MOS transistors in a standard sigma-delta modulator is accompanied by other performance problems. For example, in audio applications, power MOS transistors drive relatively low impedances and must therefore have output impedances smaller than one ohm for good overall efficiency. As a result, the switching characteristics of such transistors are relatively slow, varying from an ideal switching characteristic in an asymmetric way, and thereby generating distortion which is typically at or above the −60 dB level. Because standard sigma-delta modulators employ digital or state feedback (e.g., D/A 106 of FIG. 1), the asymmetric edges of the power transistor output are not seen by the integrator stages. Consequently, standard sigma-delta modulators are not able to correct for the distortion introduced by the power MOS transistors because of the exclusive use of state feedback.

Moreover, because modern sigma-delta modulators use sampled integrators, simply employing state feedback via a digital-to-analog converter to the integrator stages has not been effective. This is due to the fact that sampled integrators tend to have aliasing problems with high frequency distortion. In addition, the delay introduced by a power MOS transistor stage causes the feedback to be increasingly uncorrelated with the input, further undermining the feedback's corrective function. The additional delay due to a power MOS transistor stage can also adversely affect circuit stability. In short, any noise reduction improvements achieved by the use of standard sigma-delta modulation are rendered insignificant by the distortion introduced by the power MOS transistors and associated driver stages.

An improvement to standard sigma-delta technology which addresses these problems is described in commonly assigned, copending U.S. Pat. application Ser. No. 08/667,925 for METHOD AND APPARATUS FOR OVERSAMPLED, NOISE-SHAPING, MIXED-SIGNAL PROCESSING filed on Jun. 20, 1996, the entire specification of which is incorporated herein by reference. In that application an oversampled, noise-shaping modulator is described which employs continuous-time feedback from the output of its switching stage rather than pure state feedback from before or after the power switching stage. The continuous-time feedback is provided in such a way as to reduce the aliasing effects on the feedback path introduced by the switching stage which might otherwise interfere with the baseband to an unacceptable degree. That is, the improved modulator of the above-described application combines the use of continuous-time feedback to compensate for low frequency distortion, and some means of attenuating the aliasing effects of high frequency distortion introduced via the feedback path.

FIG. 2 is a simplified block diagram of an embodiment of a second-order modified oversampled, noise-shaping digital amplifier 200 designed according to a specific embodiment of the invention described in the above-referenced application. An input signal is introduced to a first continuous-time integrator stage 202 via adder 204. The output of first integrator stage 202 is transmitted to a second continuous-time integrator stage 206 via adder 208. A clocked comparator stage 210 sampled at sample frequency $f_s$ receives the output of second integrator stage 206 and transmits the resulting logic signal to power switching stage 212. The continuous-time output of power switching stage 212 is fed back to first integrator stage 202 via continuous-time gain stage 214 and adder 204. Continuous-time feedback is also provided to second integrator stage 206 via continuous-time gain stage 216 and adder 208. In this example, an anti-aliasing filter is not employed in the feedback path because the integrator stages are continuous-time integrators which inherently reject high frequencies. If, on the other hand, integrator stages 202 and 206 comprise sampled integrators, the feedback to gain stages 214 and 216 would be via an anti-aliasing filter. Such a filter would typically be a low pass filter which reduces the aliasing effects of the high frequency distortion generated by the power switching stage by removing the high frequency distortion from the continuous-time feedback signal. For additional details regarding continuous-time feedback with sampled integrators, please refer to the above-referenced copending patent application.

The modified sigma-delta technology described in the above-referenced application provides a highly efficient, low noise alternative to PWM in a wide variety of applications. However, because there is a limit on the amount of gain which can be introduced in the oversampled modulator loop, and therefore a limit on the dynamic range of the modulator, there are some applications for which even the excellent noise performance of the modulator of the above-referenced application may need improvement. For example, in the field of power amplifiers, a very low noise floor and a high dynamic range with low distortion are obviously desirable. In other power switching technologies (e.g., regulators, motor drivers, etc.) other performance improvements (e.g., reduced ripple and component size) are desirable. However, as mentioned above, significant improvement in these parameters generally requires increasing the gain in the oversampled modulator loop. The modulator loop gain, in turn, is limited, at least in part, by the modulator's sampling frequency. Unfortunately, increasing the sampling frequency, i.e., increasing the oversampling ratio, to improve the dynamic range is ultimately of limited utility in that power switching applications have some minimum pulse width below which the resulting distortion would quickly overcome any improvements in dynamic range. That is, power switching applications typically employ large power devices which swing very nearly from power supply rail to power supply rail. In addition, the speed at which these power devices can switch is limited by their typically large parasitic components. Therefore, because the switching of these power devices is characterized by very large and relatively slow transitions, the input pulses to the power switching stage must be sufficiently long and sufficiently far apart to ensure that the transitions do not overlap to an unacceptable degree. For further information regarding the characteristics of power devices, please refer to Power MOSFETS: Theory and Application by Duncan A. Grant and John Gowar (©1989 John Wiley & Sons, Inc.), and Smart Power ICs: Technologies and Applications edited by B. Murari, F. Bertotti, and G. A. Vignola (©1996 Springer Verlag).

The following example should be illustrative. Through the use of an oversampled modulator, the noise floor of a power amplifier may be improved from 9 to 21 dB (or more) per octave of oversampling depending on the order of the modulator, i.e., 9 dB for a first-order modulator to 21 dB for a third-order modulator (see the references cited above and the above-referenced patent application). On average, today's power MOSFETs can typically be switched up to around 1.5 MHz. Thus, a designer of an audio power amplifier might set the sampling frequency of the oversampled modulator at 3 MHz, providing 64×oversampling (i.e., $2^6$) with respect to an audio input signal. Assuming a third-order modulator, the corresponding theoretical input-referred noise floor, i.e., the dynamic range, of the amplifier would be given by (21 dB)×($\log_2 64$) or 126 dB. Actual third-order modulator performance is typically 20–30 dB worse than this due to practical considerations. While this level of performance might be suitable for some low end applications, it is not sufficient for a high-end, high-power audio amplifier as the high gain associated with such an amplifier will boost the input-referred noise to unacceptable levels. Increasing the sample frequency to 6 MHz yields an oversampling ratio of 128×which, in turn, provides a theoretical noise floor/dynamic range of (21 dB)×($\log_2 128$) or 147 dB. While this is sufficient for many high end applications, the sampling frequency is too fast for today's power devices One possible alternative to increasing the sampling frequency is to make the oversampled modulator a fourth-order modulator to obtain a theoretical dynamic range of (27 dB)×($\log_2 64$) or 162 dB. Unfortunately, there are at least two practical problems with this approach. First, it is already a difficult problem to stabilize a third-order modulator because of the delay introduced by the power switching stage. It is even more difficult to stabilize a fourth-order modulator. Second, even though the dynamic range would theoretically increase with a fourth-order modulator, the output swing which could be achieved would be reduced. For a discussion of this phenomenon, please refer to T. Ritoniemi, T. Karema, and H. Tenhunen, Design of Stable High Order 1-bit Sigma-Delta Modulators (IEEE Proc. ISCAS '90, pp.3267–3270, May 1990), the entirety of which is incorporated herein by reference. This output swing reduction is unacceptable in power switching applications because the output signal of a power amplifier must typically be able to go from rail to rail, or at least very close.

It is therefore apparent that there is a need for a way in which the noise floor/dynamic range of a power switching amplifier may be improved beyond the level currently attainable with oversampled, noise-shaping modulators.

SUMMARY OF THE INVENTION

Because the transition time of today's power switching devices ultimately limit the rate at which such devices can be switched, the motivation was to look at the input waveforms to such devices to determine what could be done to reduce the noise floor without the risk of the input transitions being spaced too closely. By analyzing the input waveforms to such power devices it was realized that the occurrence of unacceptably narrow pulses is relatively rare and, for small signal levels, virtually non-existent. Thus, the elimination of any such narrow pulses through the use of pulse qualification circuitry, i.e., circuitry which constrains the time between transitions to be greater than some minimum, was introduced. However, when this was done for larger input signals, loop stability became a problem because of the delay introduced by the pulse qualification circuitry. To correct this instability, the modulator sampling frequency was increased.

Therefore, according to the present invention, an improvement to the oversampled, noise-shaping modulator described in the above-referenced patent application is provided which achieves a lower input-referred noise floor, i.e., a higher dynamic range, by increasing the oversampling ratio without suffering the consequences of unacceptably narrow pulse widths. The invention is especially useful in power switching applications in which narrow pulses are unacceptable such as, for example, audio amplifiers, switching regulators, power amplifiers, motor control, power factor correction, resonant mode switching, etc. The present invention achieves this improvement by increasing the sampling frequency, i.e., the rate at which the oversampled modulator is clocked, and the gain of the modulator loop, while adding pulse qualification logic before the switching stage to eliminate unacceptably narrow pulses.

According to a specific embodiment, the pulse qualification logic of the present invention receives the output of the A/D converter (or comparator) in the oversampled modulator loop and does not allow transitions to be sent to the switching stage within some number of clock cycles. The number of clock cycles may determined with reference to a number of considerations including, for example, the speed of the switching devices in the switching stage, a desired relationship between noise floor and output swing (for a given maximum clock rate), the desired switching frequency, etc. While this avoids the problems associated with the spacing between transitions, it introduces a delay and nonlinearity in the modulator loop which can actually degrade the dynamic range and cause instability. Therefore, to address this concern, the modulator sampling frequency is increased beyond what was necessary to achieve a lower noise floor. Thus, the modulator loop gain and the sampling frequency are simultaneously increased (with the sampling frequency being increased more rapidly to maintain loop stability), thereby improving the dynamic range and noise floor while not allowing unacceptably narrow pulses to go to the switching stage.

Either of these two features implemented alone may cause problems for an ordinary modulator. An increase in the sampling frequency, by itself, may result in pulses which are too narrow for power switching devices to pass efficiently. Adding pulse qualification logic to a modulator without making other appropriate adjustments, i.e., increasing the sample frequency, introduces a delay and nonlinearity which degrades the modulator's dynamic range and may cause instability. But, by combining these elements, the present invention realizes significant improvements in noise performance and dynamic range.

Thus, the present invention provides an oversampled, noise shaping signal processor having at least one integrator stage in a feedback loop. A sampling stage in the feedback loop is coupled to the at least one integrator stage. The sampling stage samples an analog signal at a sample frequency. Qualification logic coupled to the sampling stage receives a pulse waveform therefrom, and ensures that signal transitions in the pulse waveform occur more than a first time period apart. A switching stage in the feedback loop is coupled to the qualification logic. The signal processor has a feedback path from the output of the switching stage to the input of the at least one integrator stage thereby closing the feedback loop.

More generally, the present invention provides a signal processing circuit comprising a frequency selective network for generating a first signal. A quantizer coupled to the frequency selective network receives the first signal and generates a quantized signal. Qualification circuitry coupled to the quantizer receives the quantized signal and generates a qualified signal. The qualification circuitry causes signal transitions in the qualified signal to occur at least a first time period apart. The signal processing circuit also has a feedback path from its output to the frequency selective network.

A further understanding of the nature and advantages of the present invention may be realized by reference to the remaining portions of the specification and the drawings.

DESCRIPTION OF SPECIFIC EMBODIMENTS

Figure 2:
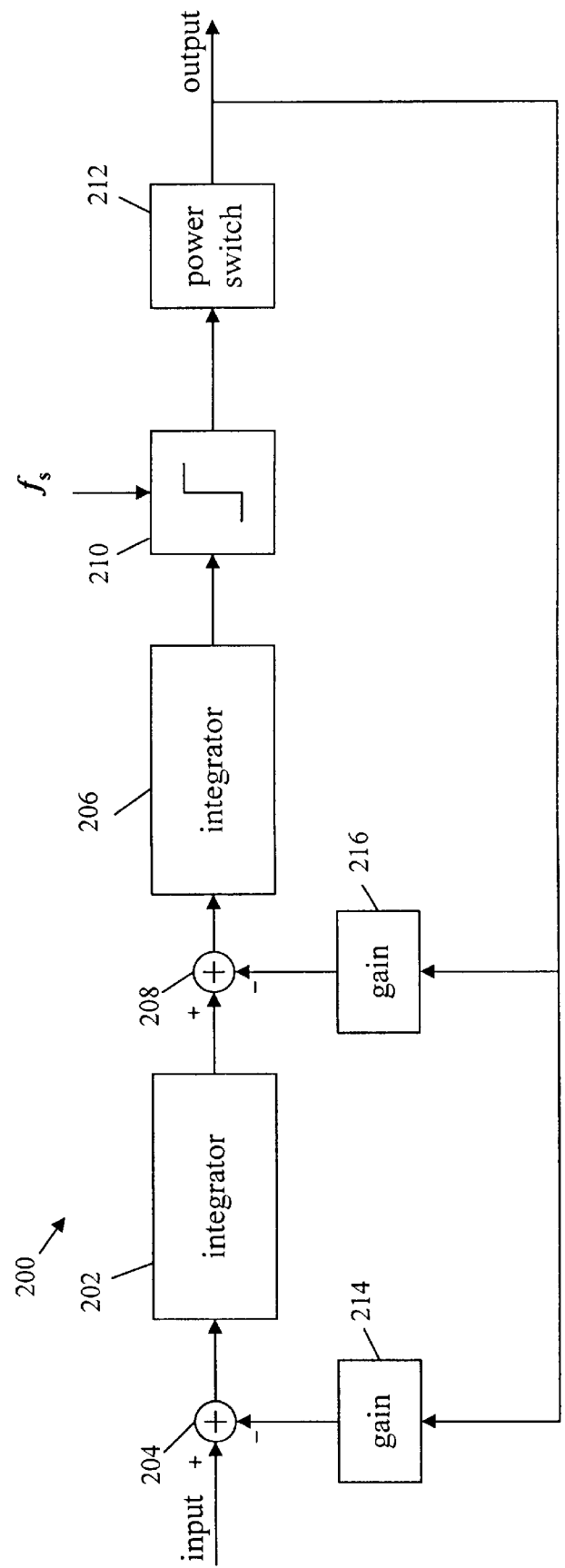
FIG. 2 is a block diagram of an oversampled, noise-shaping modulator described in a related application.
Figure 3:
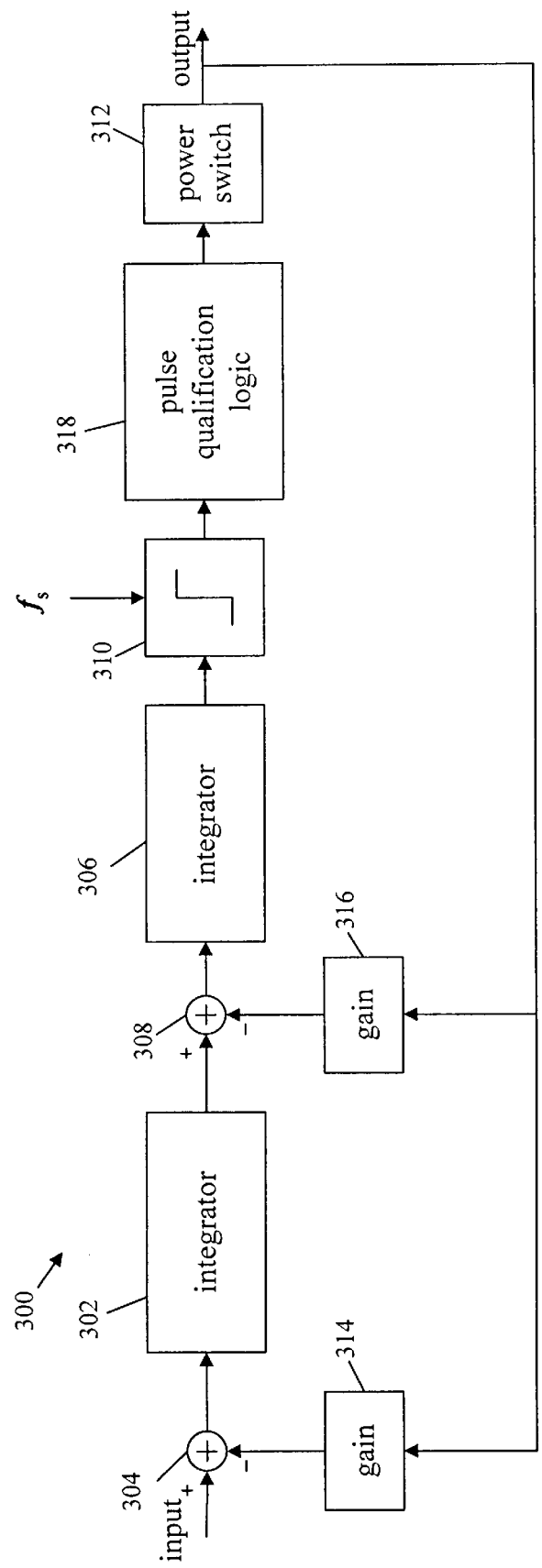
FIG. 3 is a block diagram of an oversampled, noise-shaping modulator according to a specific embodiment of the present invention.

FIG. 3 is a block diagram of an oversampled, noise-shaping modulator 300 designed according to a specific embodiment of the present invention. The input to integrator stage 302 is received via adder 304. The input to integrator stage 306 is transmitted from integrator stage 302 via adder 308. A comparator stage 310 with a sample frequency $f_s$ receives the output of second integrator stage 306 and transmits the resulting logic signal to qualification logic 318. Qualification logic 318 ensures that the width of pulses sent to power switching stage are at least some minimum width. The operation of a particular embodiment of qualification logic 318 is described below with reference to FIG. 5. The qualified pulse waveform is then transmitted to power switching stage 312. The continuous-time output of power switching stage 312 is fed back to first integrator stage 302 via continuous-time gain stage 314 and adder 304. Continuous-time feedback is also provided to second integrator stage 306 via continuous-time gain stage 316 and adder 308. An anti-aliasing filter is not employed in the feedback path because, as discussed above with reference to FIG. 2, the integrator stages in this embodiment are continuous-time integrators which inherently reject high frequencies.

Figure 4:
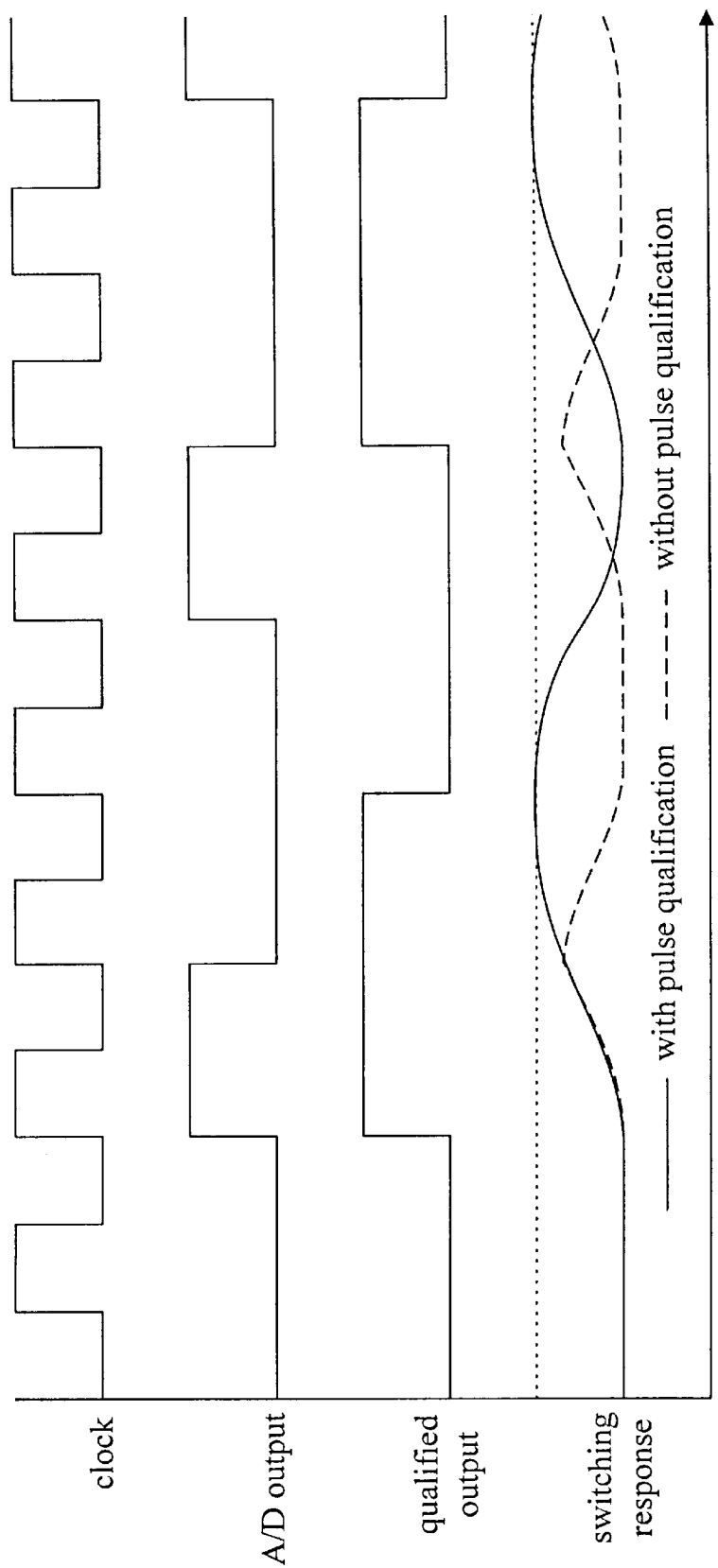
FIG. 4 is a series of waveforms illustrating the operation of a specific embodiment of the present invention.

FIG. 4 shows a series of waveforms from various points in the modulator 300 of FIG. 3. The switching response shows the output of the power switching stage both with the pulse qualification of the invention enabled (solid waveform) and disabled (dashed waveform). In this example, comparator stage 310 is a 1-bit analog-to-digital (A/D) converter which is triggered on the positive rising edge of the clock signal. The clock signal is the sample frequency input to A/D converter 310, the A/D output signal is the output of A/D converter 310, the qualified output signal is the output of qualification logic 318, and the switching response signal is the output of power switching stage 312. As shown, the qualification logic ensures that pulses are sent to the power switching devices at most once every 2 clock cycles (see the qualified output signal). It will be understood that, given the response time of power switching stage 312, the switching response signal shown would not have been possible without the qualification logic. It is important to note that the qualification logic operates on the same edge as the A/D converter, i.e., the positive rising edge of the clock signal. This may be achieved by combining the qualification logic and the A/D converter to thereby avoid any additional and undesirable logic delays. As shown in FIG. 4, in the situation where the pulse qualification is disabled, the output of the power switching stage never quite reaches the positive rail (i.e., the dotted line) because the input pulses to the power switching stage are too narrow and the upward and downward transitions of the power devices therefore overlap.

The operation of a comparator and a glitch-free state machine implementation of pulse qualification logic will be described with reference to the schematic of FIG. 5 for the purpose of illustrating the concept of the present invention. Different qualification levels corresponding to different sampling frequencies may be selected using the mode 0 and mode 1 inputs. According to a specific embodiment, the level of pulse qualification may be selected to match a desired multiple of the modulator clock rate as shown in Table 1. As can be seen by referring to FIG. 5, the pulse qualification logic may be bypassed by bringing the BYPASS input high, thereby allowing pulses to go from the comparator to the power switching stage without qualification. As shown in Table 1 this might be done where an increase in the c lock rate is not necessary.

TABLE 1

| BYPASS | mode 0 | mode 1 | multiple of clock rate |
|--------|--------|--------|------------------------|
| 0 | 0 | 0 | 16X |
| 0 | 0 | 1 | 8X |
| 0 | 1 | 0 | 4X |
| 0 | 1 | 1 | 2X |
| 1 | x | x | 1X | x = don't care

Referring to the schematic of FIG. 5, the initial state of circuit 500 comprising a comparator and qualification logic will be described. Initially the output of nand 502 is low thereby clearing D flip-flops 504, 506, 508 and 510, and setting multiplexer 512 such that the output of comparator 514 goes directly to the D input of flip-flop 516. Note that for the output of nand 502 to be low, the outputs of flip-flops 516 and 518 must be at the same level. In addition, as a result of flip-flops 504–510 being cleared, the output of nor 520 goes high. This in turn means that multiplexer 522 selects the Q output of flip-flop 518 to be fed back to the D input of flip-flop 518, i.e., flip-flop 518 holds its state if its clock is triggered. With the output of x-nor 524 high, x-nor 526 acts as a non-inverting buffer of its input from flip-flop 504. This means flip-flop 504 holds its state when clocked, thereby preventing counter 528 (indicated by the dashed line) comprising flip-flops 504–510 from being clocked.

Flip-flops 504, 516 and 518 are then clocked via the clock input. If the state of flip-flop 516 remains unchanged, all of the above-described logic levels remain the same. If, however, the state of flip-flop 516 changes, it will no longer be the same as flip-flop 518 and the output of x-nor 524 will then go low. This, in turn, changes the state of multiplexer 512 (via nand 502) which connects the Q output of flip-flop 516 to its own D input, thereby latching the state of flip-flop 516. A logic low on the output of x-nor 524 turns x-nor 526 into an inverter, thereby causing flip-flop 504 to act as a divide-by-two of the sample frequency from the clock input. The counter will then only be clocked until the control logic causes the output of nor 520 to go low which changes the state of multiplexer 522 which then connects the Q output of flip-flop 516 to the D input of flip-flop 518. This causes the states of flip-flops 516 and 518 to become the same again on the next clock edge, bringing the output of x-nor 524 high and the output of nand 502 low. In this way, the output pulse width, i.e., the qualification delay, is determined by programmable counter 528 plus one clock cycle.

As implied above, the qualification logic may be bypassed. This is accomplished by bringing the BYPASS input high, thereby tying the output of nand 502 high. As a result, the output of comparator 514 is gated to the output (via multiplexer 512 and flip-flop 516) without the pulse qualification delay.

Figure 6:
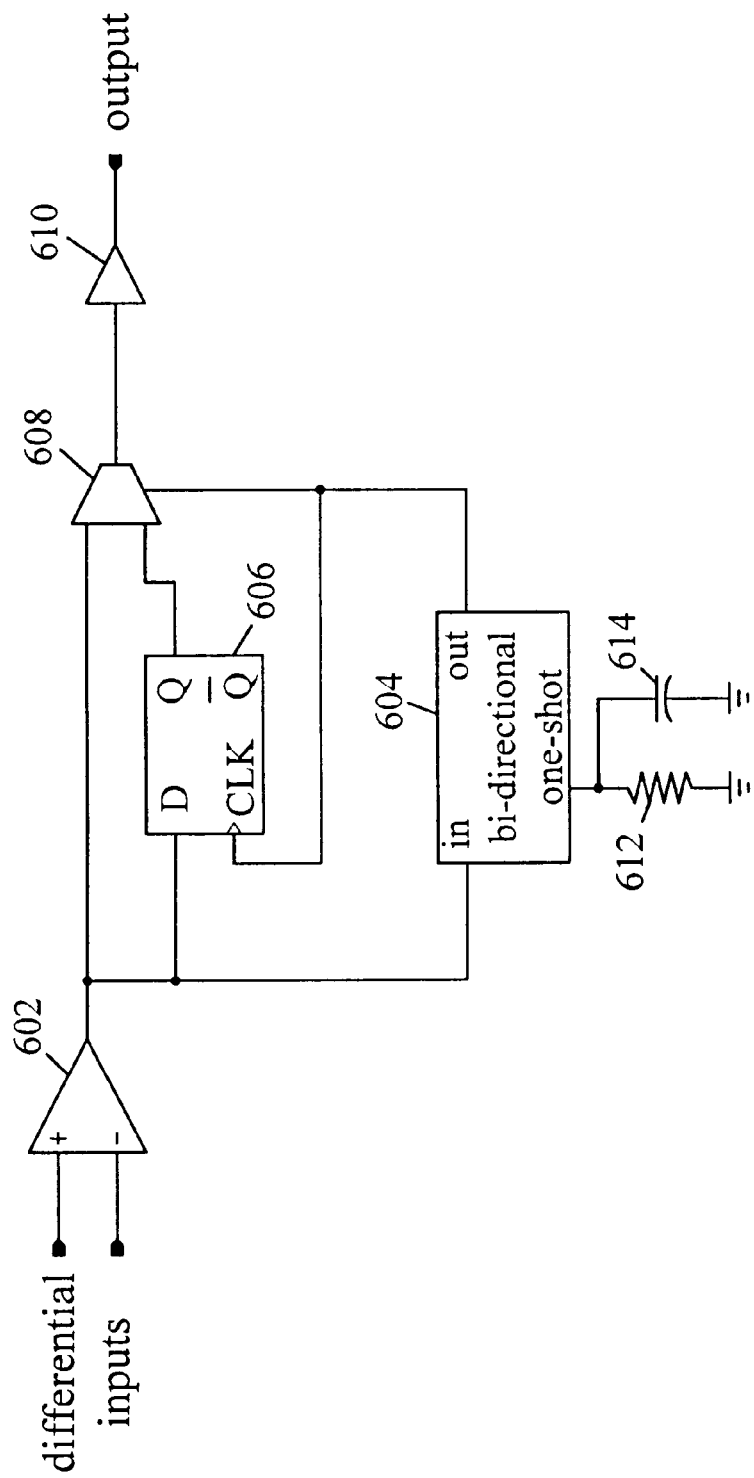
FIG. 6 is a block diagram of an unclocked embodiment of the pulse qualification circuitry of the present invention.

At the limit, if the sample frequency of a modulator loop incorporating the present invention were increased to infinity, i.e., the modulator would no longer be clocked, the pulse qualification circuitry of the present invention could be implemented using a one-shot configured to hold an input pulse high for at least some minimum time period. One example of such an implementation is shown in FIG. 6. When unclocked comparator 602 changes state, bi-directional one-shot 604 goes to a logic 1. This clocks the comparator output into flip-flop 606 and configures multiplexer 608 to transmit the output of flip-flop 606 to the output of the circuit via buffer 610. When one-shot 604 times out (as determined by resistor 612 and capacitor 614), multiplexer 608 is configured to transmit the output of comparator 602 to the output of the circuit until another transition occurs. Thus, if a pulse from comparator 602 is shorter than the timeout of one-shot 604, the output pulse of the circuit is the length of the timeout. On the other hand, if the comparator pulse is longer than the timeout, the output pulse will be of the same duration as the comparator pulse.

While the invention has been particularly shown and described with reference to specific embodiments thereof, it will be understood by those skilled in the art that changes in the form and details of the disclosed embodiments may be made without departing from the spirit or scope of the invention. For example, the embodiment discussed with reference to FIG. 4 employs an A/D converter. However, it will be understood that, as discussed with reference to FIGS. 3 and 5, a comparator may be employed instead of the A/D converter. In addition, the comparator need not be a clocked comparator as shown in FIG. 3, but may be an unclocked comparator as shown in FIG. 5 or any unclocked quantizer.

Figure 5:
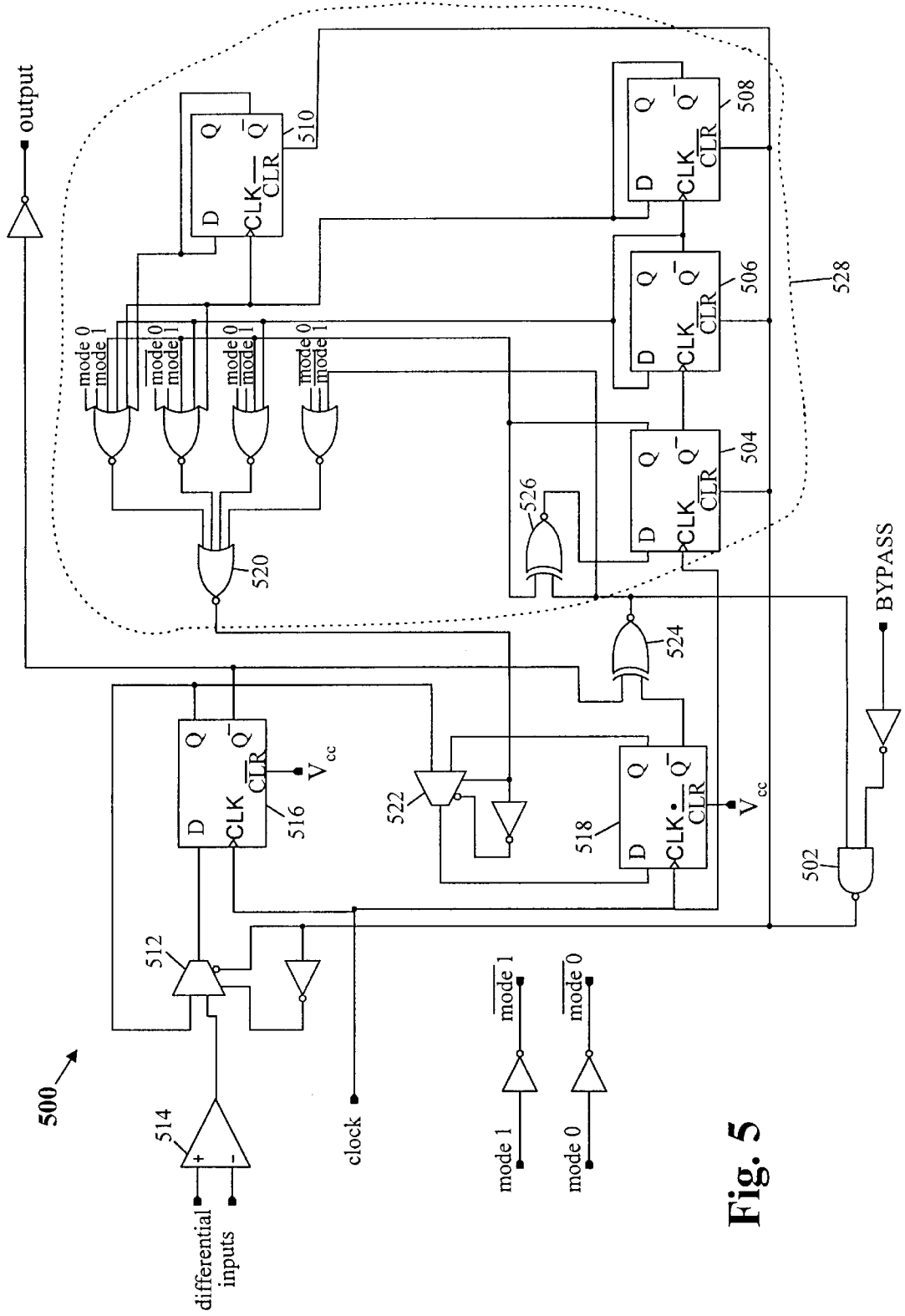
FIG. 5 is a schematic showing the implementation of a specific embodiment of the pulse qualification logic of the present invention.

It will also be understood, for example, that the pulse qualification logic of the present invention may be implemented using an analog RC timer (or any type of one-shot device) instead of the programmable digital timer shown in FIG. 5. In fact, the present invention may be implemented using an RC timer and an unclocked comparator wherein the RC timer does not allow transitions to occur within a certain period of time determined by the RC constant. Additionally, the embodiment of FIG. 5 represents only one implementation of the qualification logic of the present invention. It will be understood that many others are possible. Moreover, even though the present invention has been described with regard to a baseband signal, it will be understood that the improved sigma-delta modulators and the teaching of the present invention described herein may be employed equally well for a band pass signal. In such an embodiment, the integrator stages may be replaced by some other type of frequency selective network such as, for example, resonators.

Figure 1:
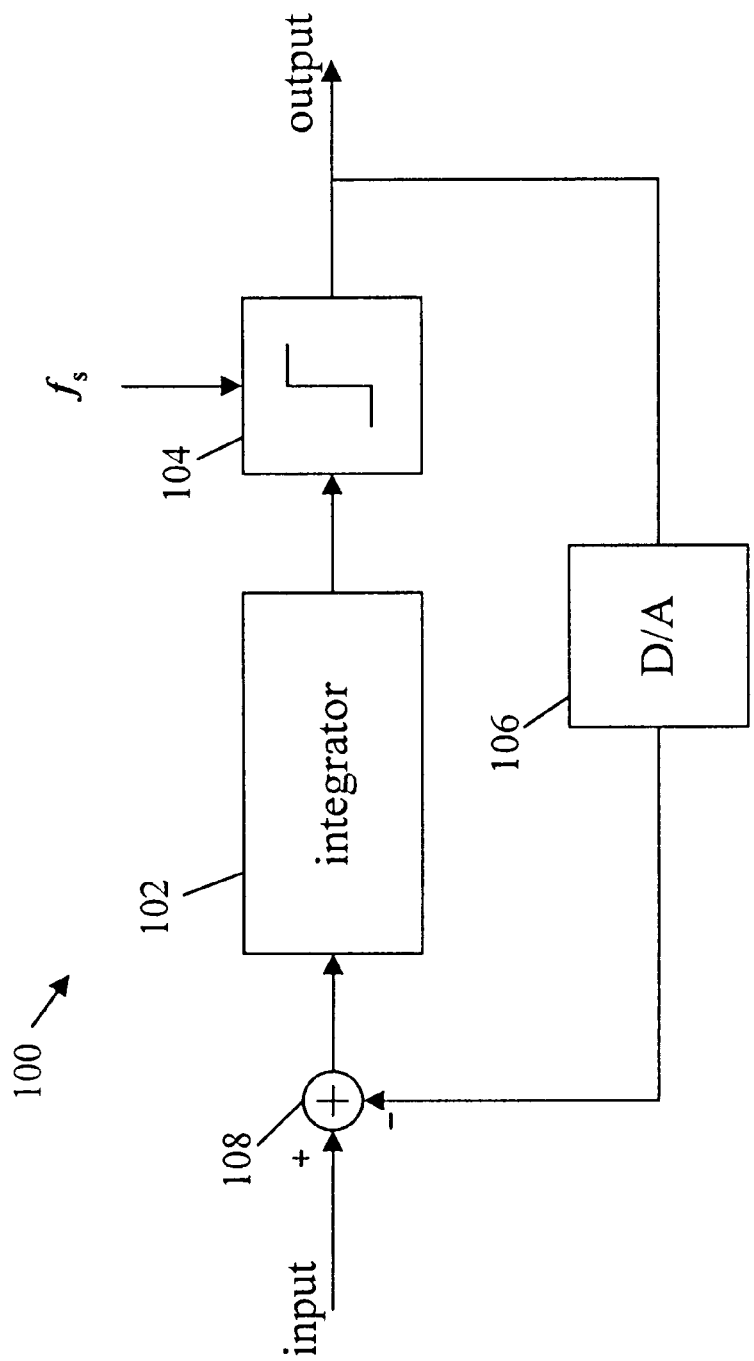
FIG. 1 is a simplified block diagram of a standard first order oversampled, noise-shaping modulator according to the prior art.

Another important point which should be noted is that the pulse qualification circuitry of the present invention is not restricted to modulator loops which include a power switching stage. For example, the pulse qualification logic may be implemented in a fully digital sigma-delta modulator which is upstream from a switching stage for which the time between transitions is critical. In such an application, the output of the modulator is encoded to prevent narrowly spaced transitions downstream. It should also be noted that the pulse qualification circuitry of the present invention may be employed in a standard sigma-delta modulator such as the modulator of FIG. 1 Therefore, the scope of the invention should be determined with reference to the appended claims.

What is claimed is:

1. An oversampled, noise shaping signal processor comprising:
   at least one integrator stage;
   a sampling stage coupled to the at least one integrator stage for sampling an analog signal received therefrom at a sample frequency;
   qualification logic coupled to the sampling stage for receiving a pulse waveform from the sampling stage and generating a qualified pulse waveform in response thereto, the qualification logic ensuring that signal transitions in the qualified pulse waveform occur at least a first time period apart;

a switching stage coupled to the qualification logic and being driven by the qualified pulse waveform, the switching stage having an output; and a feedback path from the output of the switching stage to the at least one integrator stage.

2. The signal processor of claim 1 wherein the first time period is determined, at least in part, with reference to characteristics of the switching stage.

3. The signal processor of claim 1 wherein the signal processor is a third-order modulator and the at least one integrator stage comprises three integrator stages.

4. The signal processor of claim 1 wherein the at least one integrator stage comprises a continuous-time integrator.

5. The signal processor of claim 1 wherein the at least one integrator stage comprises a sampled integrator.

6. The signal processor of claim 1 wherein the sampling stage comprises a comparator.

7. The signal processor of claim 6 wherein the comparator is unclocked.

8. The signal processor of claim 1 wherein the sampling stage comprises an analog-to-digital converter.

9. The signal processor of claim 1 wherein the qualification logic comprises timer circuitry for determining the first time period.

10. The signal processor of claim 9 wherein the timer circuitry comprises continuous-time circuitry.

11. The signal processor of claim 9 wherein the timer circuitry comprises digital logic.

12. The signal processor of claim 1 wherein the feedback path comprises an anti-aliasing filter.

13. A signal processing circuit comprising:

a frequency selective network for generating a first signal;

a quantizer coupled to the frequency selective network for receiving the first signal and generating a quantized signal;

qualification circuitry coupled to the quantizer for receiving the quantized signal and generating a qualified signal, the qualification circuitry causing signal transitions in the qualified signal to occur at least a first time period apart;

an output coupled to the qualification circuitry; and a feedback path from the output to the frequency selective network.

14. The signal processing circuit of claim 13 wherein the output is coupled directly to the qualification circuitry.

15. The signal processing circuit of claim 14 wherein the feedback path comprises a digital-to-analog converter.

16. The signal processing circuit of claim 13 wherein the output is coupled to the qualification circuitry via a switching device.

17. The signal processing circuit of claim 16 wherein the feedback path comprises a continuous-time feedback path.

18. The signal processing circuit of claim 13 wherein the frequency selective network comprises at least one integrator.

19. The signal processing circuit of claim 13 wherein the frequency selective network comprises at least one resonator.

20. The signal processing circuit of claim 13 wherein the quantizer comprises a comparator.

21. The signal processing circuit of claim 20 wherein the comparator is sampled at a sample frequency.

22. The signal processing circuit of claim 20 wherein the comparator is unclocked.

23. The signal processing circuit of claim 13 wherein the quantizer comprises an analog-to-digital converter.

24. The signal processing circuit of claim 13 wherein the qualification circuitry comprises timer circuitry for determining the first time period.

25. The signal processing circuit of claim 24 wherein the timer circuitry comprises digital logic.

26. The signal processing circuit of claim 24 wherein the timer circuitry comprises continuous-time circuitry.

27. The signal processing circuit of claim 24 wherein the timer circuitry comprises a one-shot device.

* * * * *